United States Patent
Kim et al.

(10) Patent No.: US 9,653,160 B2
(45) Date of Patent: May 16, 2017

(54) MEMORY DEVICE REDUCING TEST TIME AND COMPUTING SYSTEM INCLUDING THE SAME

(71) Applicant: SAMSUNG ELECTRONICS CO., LTD., Suwon-si, Gyeonggi-do (KR)

(72) Inventors: Yun-Kil Kim, Suwon-si (KR); Jeong-Yun Cha, Asan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/823,513

(22) Filed: Aug. 11, 2015

(65) Prior Publication Data
US 2016/0148682 A1 May 26, 2016

(30) Foreign Application Priority Data
Nov. 21, 2014 (KR) .......................... 10-2014-0163266

(51) Int. Cl.
*G11C 7/00* (2006.01)
*G11C 17/18* (2006.01)
(Continued)

(52) U.S. Cl.
CPC .......... *G11C 13/0023* (2013.01); *G11C 29/24* (2013.01); *G11C 29/26* (2013.01); *G11C 29/76* (2013.01); *G11C 2029/2602* (2013.01)

(58) Field of Classification Search
USPC .......................... 365/200, 201, 225.7, 230.03
See application file for complete search history.

(56) References Cited

U.S. PATENT DOCUMENTS

| | | | |
|---|---|---|---|
| 5,327,382 A | 7/1994 | Seno et al. | |
| 6,097,644 A * | 8/2000 | Shirley | G11C 29/787 365/200 |

(Continued)

FOREIGN PATENT DOCUMENTS

| | | |
|---|---|---|
| KR | 1020000032852 | 6/2000 |
| KR | 1020000061079 | 10/2000 |

(Continued)

*Primary Examiner* — Trong Phan
(74) *Attorney, Agent, or Firm* — F. Chau & Associates, LLC

(57) ABSTRACT

A memory device includes memory cell array and an address decoder. The memory cell array includes a normal memory region and a redundant memory region. The normal memory region operates in response to data signal and plurality of normal memory region signals. The redundant memory region operates in response to data signal and plurality of redundant memory region signals. The address decoder includes normal memory region signal generator and redundant memory region signal generator. The normal memory region signal generator activates first normal memory region signals and redundant memory region signal generator activates first redundant memory region signal simultaneously when address decoder operates in test mode. First normal memory region signals correspond to an address signal and are included in plurality of normal memory region signals. A first redundant memory region signal corresponds to an address signal and is included in the plurality of redundant memory region signals.

17 Claims, 17 Drawing Sheets

(51) Int. Cl.
  *G11C 8/00*   (2006.01)
  *G11C 13/00*  (2006.01)
  *G11C 29/00*  (2006.01)
  *G11C 29/24*  (2006.01)
  *G11C 29/26*  (2006.01)

(56) References Cited

U.S. PATENT DOCUMENTS

| | | | |
|---|---|---|---|
| 6,259,639 B1 * | 7/2001 | Hashizume | G11C 29/44 |
| | | | 365/200 |
| 6,552,939 B1 | 4/2003 | Miki et al. | |
| 6,634,003 B1 * | 10/2003 | Phan | G11C 29/76 |
| | | | 365/200 |
| 6,731,560 B2 | 5/2004 | Yoon et al. | |
| 7,047,461 B2 | 5/2006 | Yamazaki et al. | |
| 7,391,662 B2 * | 6/2008 | Kuroki | G11C 29/787 |
| | | | 365/200 |
| 7,679,133 B2 | 3/2010 | Son et al. | |
| 8,050,121 B2 | 11/2011 | Yagishita | |
| 8,542,544 B2 * | 9/2013 | Komatsu | G11C 29/24 |
| | | | 365/200 |
| 8,553,466 B2 | 10/2013 | Han et al. | |
| 8,559,235 B2 | 10/2013 | Yoon et al. | |
| 8,654,587 B2 | 2/2014 | Yoon et al. | |
| 2011/0233648 A1 | 9/2011 | Seol et al. | |

FOREIGN PATENT DOCUMENTS

| | | |
|---|---|---|
| KR | 1020010019340 | 3/2001 |
| KR | 1020030052399 | 6/2003 |
| KR | 1020030093410 | 12/2003 |
| KR | 1020050095980 | 10/2005 |
| KR | 1020060020299 | 3/2006 |
| KR | 1020060038808 | 5/2006 |

* cited by examiner

MEMORY DEVICE REDUCING TEST TIME AND COMPUTING SYSTEM INCLUDING THE SAME

CROSS-REFERENCE TO RELATED APPLICATION

This U.S. Non-provisional application claims priority under 35 USC §119 to Korean Patent Application No. 10-2014-0163266, filed on Nov. 21, 2014, in the Korean Intellectual Property Office (KIPO), the disclosure of which is incorporated by reference in its entirety herein.

BACKGROUND

1. Technical Field

Exemplary embodiments of the inventive concept relate generally to a memory device having a normal memory region and a redundant memory region, and more particularly to a memory device capable of a performing a test on the normal memory region and the redundant memory region, and a computing system including the same.

2. Discussion of Related Art

A memory device resulting from a manufacturing process may include a number of faulty memory cells. A memory cell array of the memory device may be divided into a normal memory region and a redundant memory region. When a faulty redundant memory cell is found during a test procedure of the redundant memory region, it may be deactivated to prevent its later use. When a faulty normal memory cell is found during a test procedure of the normal memory region, a function of the memory device may be recovered by replacing the faulty normal memory cell with one of the redundant memory cells.

An infant fault test of the memory device denotes a test to find infant faults of the memory device by executing a lot of tests to the normal memory region and a redundant memory region before the memory device is sold and used by normal users. However, since performing the infant fault test of the memory device can take a great deal of time, its use can increase manufacturing costs.

SUMMARY

At least one exemplary embodiment of the inventive concept provides a memory device that may reduce test time by simultaneous tests of a normal memory region and a redundant memory region.

At least one exemplary embodiment of the inventive concept provides a computing system including a memory device that may reduce test time by simultaneous tests of a normal memory region and a redundant memory region.

According to an exemplary embodiment of the inventive concept, a memory device includes a memory cell array and an address decoder. The memory cell array includes a normal memory region and a redundant memory region. The normal memory region operates in response to a data signal and a plurality of normal memory region signals. The redundant memory region operates in response to the data signal and a plurality of redundant memory region signals. The address decoder includes a normal memory region signal generator and a redundant memory region signal generator. The normal memory region signal generator activates first normal memory region signals and the redundant memory region signal generator activates a first redundant memory region signal simultaneously when the address decoder operates in a test mode. The first normal memory region signals correspond to an address signal and are included in the plurality of the normal memory region signals. The first redundant memory region signal corresponds to the address signal and is included in the plurality of the redundant memory region signals.

In an exemplary embodiment, if the address decoder operates in the test mode, the plurality of the redundant memory region signals is activated once respectively while the plurality of the normal memory region signals are activated once respectively.

In an exemplary embodiment, the memory cell array includes a plurality of blocks. The normal memory region may include a plurality of normal memory sub-regions. The redundant memory region may include a plurality of redundant memory sub-regions.

In an exemplary embodiment, a first block among the blocks includes a first normal memory sub-region among the normal memory sub-regions and a first redundant memory sub-region among the redundant memory sub-regions. A second block among the blocks may include a second normal memory sub-region among the normal memory sub-regions and a second redundant memory sub-region among the redundant memory sub-regions.

In an exemplary embodiment, the first normal memory region signals correspond to the first normal memory sub-region and the first redundant memory region signal correspond to the first redundant memory sub-region.

In an exemplary embodiment, the first normal memory region signals corresponds to the first normal memory sub-region and the first redundant memory region signal corresponds to the second redundant memory sub-region.

In an exemplary embodiment, the first redundant memory region signal does not correspond to the second redundant memory sub-region when a sense amplifier generates an output signal by amplifying a data signal of a first memory cell included in the first block based on a reference signal of a second memory cell, which is included in the second block and corresponds to the first memory cell, and the first normal memory region signals correspond to the first normal memory sub-region.

In an exemplary embodiment, the sense amplifier is disposed between the first block and the second block.

In an exemplary embodiment, the blocks include a first block and a second block. The first block may include a first normal memory sub-region among the normal memory sub-regions and a first redundant memory sub-region among the redundant memory sub-regions. The second block may include a second normal memory sub-region among the normal memory sub-regions.

In an exemplary embodiment, the first normal memory region signals correspond to the first normal memory sub-region and the first redundant memory region signal correspond to the first redundant memory sub-region.

In an exemplary embodiment, the first normal memory region signals correspond to the second normal memory sub-region and the first redundant memory region signal correspond to the first redundant memory sub-region.

In an exemplary embodiment, the address decoder further includes a block signal generator configured to output logical OR operation result of the plurality of the redundant memory region signals as a block signal.

In an exemplary embodiment, if the address decoder operates in the test mode, the normal memory region signal generator activates the first normal memory region signals irrespective of the block signal.

In an exemplary embodiment, the normal memory region signal generator activates the first normal memory region signals when the normal memory region signal generator operates in a normal mode and the block signal has a logical low level. The normal memory region signal generator may deactivate the plurality of the normal memory region signals when the normal memory region signal generator operates in the normal mode and the block signal has logical high level.

In an exemplary embodiment, the address decoder operates in the test mode when a test signal has a logical high level. The address decoder may operate in a normal mode when the test signal has a logical low level.

In an exemplary embodiment, the redundant memory region signal generator includes a first redundant memory region signal generation unit, a second redundant memory region signal generation unit, and a selection unit. The first redundant memory region signal generation unit may generate first internal redundant memory region signals which are activated once respectively while the plurality of the normal memory region signals are activated once respectively based on the address signal. The second redundant memory region signal generation unit may generate second internal redundant memory region signals by comparing a value of the address signal and faulty address values stored in a fuse circuit. The selection unit may output the first internal redundant memory region signals as the plurality of the redundant memory region signals when the test signal has logical high level. The selection unit may output the second internal redundant memory region signals as the plurality of the redundant memory region signals when the test signal has logical low level.

In an exemplary embodiment, the first redundant memory region signal generation unit includes an activation frequency controller configured to deactivate the first internal redundant memory region signals when a portion of the address signal is different from a user pre-determined value.

In an exemplary embodiment, the redundant memory region signal generator includes a redundant memory region signal generation unit, and a selection unit. The redundant memory region signal generation unit may generate internal redundant memory region signals by comparing a value of the address signal and faulty address values stored in a fuse circuit. The selection unit may output a portion of the plurality of the normal memory region signals as the plurality of the redundant memory region signals when the test signal has a logical high level. The selection unit may output the internal redundant memory region signals as the plurality of the redundant memory region signals when the test signal has a logical low level.

In an exemplary embodiment, the plurality of the normal memory region signals are word line signals of the normal memory region or bit line signals of the normal memory region, respectively. The plurality of the redundant memory region signals may be word line signals of the redundant memory region or bit line signals of the redundant memory region, respectively.

According to an exemplary embodiment of the inventive concept, a computing system includes a processor, a memory device, and a memory device. The processor generates a data signal and an address signal. The memory device executes parallel tests. The memory device includes a memory cell array, and an address decoder. The memory cell array includes a normal memory region and a redundant memory region. The normal memory region operates in response to the data signal and a plurality of normal memory region signals. The redundant memory region operates in response to the data signal and a plurality of redundant memory region signals. The address decoder includes a normal memory region signal generator and a redundant memory region signal generator. The normal memory region signal generator activates first normal memory region signals and the redundant memory region signal generator activates a first redundant memory region signal simultaneously when the address decoder operates in a test mode. The first normal memory region signals correspond to the address signal and are included in the plurality of the normal memory region signals. The first redundant memory region signal corresponds to the address signal and is included in the plurality of the redundant memory region signals.

According to an exemplary embodiment of the inventive concept, a memory device includes a memory cell array and an address decoder. The memory cell array includes a normal memory region and a redundant memory region. The address decoder is configured to simultaneously activate a plurality of normal memory signals and a first redundant memory region signal during a test mode, apply the normal memory signals to the normal memory region to test the normal memory region, and apply the first redundant memory region signal to test a first part of the redundant memory region.

In an exemplary embodiment, the memory deactivates a first memory cell in the first part of the redundant memory region when the tests determine the first memory cell is faulty, and the memory device replaces a second memory cell in the normal memory region with the first memory cell when the tests determine the second memory cell is faulty and the first memory cell is non-faulty.

In an exemplary embodiment, the memory device further includes an OR gate configured to perform an OR operation on the first redundant memory region signal and a second redundant memory region signal, the address decoder activates the normal memory region signal during a normal mode when the block signal has a logical low level, the address decoder deactivates the normal memory region signals during the normal mode when the block signal has a logical high level, and the second redundant memory signal is used to test a second part of the redundant memory region different from the first part.

BRIEF DESCRIPTION OF THE DRAWINGS

Exemplary embodiments of the inventive concept will be more clearly understood from the following detailed description taken in conjunction with the accompanying drawings.

DETAILED DESCRIPTION

Figure 1:
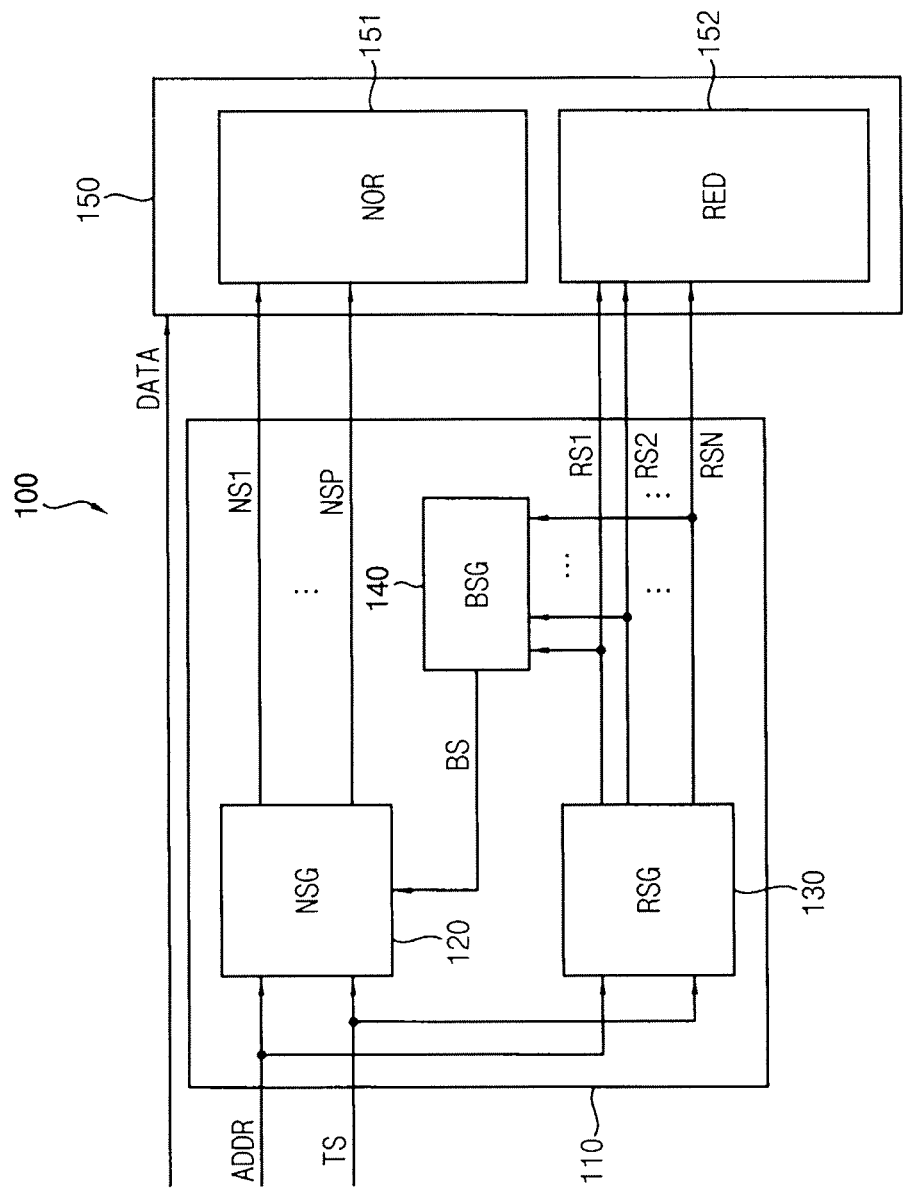
FIG. 1 is a block diagram illustrating a memory device according to an exemplary embodiment of the inventive concept.

The inventive concept will be described more fully hereinafter with reference to the accompanying drawings, in which exemplary embodiments thereof are shown. The present inventive concept may, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that when an element is referred to as being "connected" or "coupled" to another element, it can be directly connected or coupled to the other element or intervening elements may be present. As used herein, the singular forms "a," "an" and "the" are intended to include the plural forms as well, unless the context clearly indicates otherwise.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate.

The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and U.S. Pat. No. 2011/0233648.

FIG. 1 is a block diagram illustrating a memory device according to an exemplary embodiment of the inventive concept.

Referring to FIG. 1, a memory device 100 includes a memory cell array 150 and an address decoder 110. The memory cell array 150 includes a normal memory region NOR 151 and a redundant memory region RED 152. The normal memory region 151 operates in response to a data signal DATA and a plurality of normal memory region signals NS1 through NSP (P is a natural number). The redundant memory region 152 operates in response to the data signal DATA and a plurality of redundant memory region signals RS1, RS2 through RSN (N is a natural number). In an exemplary embodiment, the number N of redundant memory region signals is less than the number P of normal memory region signals. The address decoder 110 includes a normal memory region signal generator NSG 120 and a redundant memory region signal generator RSG 130. In an exemplary embodiment, the normal memory region signal generator NSG 120 and/or the redundant memory region signal generator RSG 130 is embodied by a field programmable gate array or a combination of logic circuits, or a processor.

The normal memory region signal generator 120 activates first normal memory region signals and the redundant memory region signal generator 130 activates a first redundant memory region signal simultaneously when the address decoder 110 operates in a test mode. The first normal memory region signals correspond to an address signal ADDR and are included in the plurality of the normal memory region signals NS1 through NSP. The first redundant memory region signal corresponds to the address signal ADDR and is included in the plurality of the redundant memory region signals RS1, RS2 through RSN.

When the first normal memory region signals and the first redundant memory region signal are activated, the address decoder 110 tests normal memory cells, which correspond to the first normal memory region signals and are included in the normal memory region 151 and tests redundant memory cells, which correspond to the first redundant memory region signal and are included in the redundant memory region 152. In an embodiment, the first normal memory region signals indicate the locations of normal memory cells in the normal memory region 151, and the first redundant memory region signal indicates a location of at least one redundant memory cell in the redundant memory region 152.

In an exemplary embodiment, a test write is performed during the test mode. For example, a test pattern can be written during the test mode to part of the normal memory region 151 and part of the redundant memory region 152 when the first normal memory region signals and the first redundant memory region signal are simultaneously activated. The test pattern is applied to the memory cell array 150 using the data signal DATA. In an exemplary embodiment, a test read is performed during the test mode. For example, test data can be read during the test mode from part of the normal memory region 151 and part of the redundant memory region 152 when the first normal memory region signals and the first redundant memory region signal are simultaneously activated. The tests may be used to determine whether a memory cell of the normal memory region 151 or the redundant memory region 152 is faulty or non-faulty. When a memory cell of the redundant memory region 152 is determined to be faulty, that memory cell can be deactivated. When a memory cell of the normal memory region 151 is determined to be faulty, that memory cell can be replaced with a non-faulty memory cell of the redundant memory region 152.

The address decoder 110 operates in the test mode when a test signal TS has a first logic state (e.g., a logical high level). The address decoder 110 operates in a normal mode when the test signal TS has a second logic state (e.g., a logical low level) different from the first logic state.

The address decoder 110 may further include a block signal generator BSG 140 configured to output a logical OR operation result of the plurality of the redundant memory region signals RS1, RS2 through RSN as a block signal BS.

If the address decoder 110 operates in the test mode, the normal memory region signal generator 120 activates the first normal memory region signals irrespective of the block signal BS. The normal memory region signal generator 120 activates the first normal memory region signals when the normal memory region signal generator 120 operates in a normal mode and the block signal BS has a first logic state (e.g., a logical low level). The normal memory region signal generator 120 deactivates the plurality of the normal memory region signals NS1 through NSP when the normal memory region signal generator 120 operates in the normal mode and the block signal BS has a second logic state (e.g., logical high level) different from the first logic state. In an exemplary embodiment, when the normal memory regions signals are deactivated, testing of the normal memory region 151 does not occur.

If the address decoder 110 operates in the test mode, the plurality of the redundant memory region signals RS1, RS2 through RSN are activated once respectively while the plurality of the normal memory region signals NS1 through NSP are activated once respectively. In an exemplary embodiment, the plurality of the redundant memory region signals RS1-RSN and the plurality of the normal memory region signals NS1 through NSP are activated in the test mode in such a manner that the normal memory region 151 and the redundant memory region 152 are driven at a same frequency.

In an exemplary embodiment, the plurality of the normal memory region signals NS1 through NSP are word line signals of the normal memory region 151, respectively. The plurality of the redundant memory region signals RS1, RS2 through RSN may be word line signals of the redundant memory region 152, respectively. For example, one of the word line signals may be used to identify/address a row of the corresponding memory region.

In an exemplary embodiment, the plurality of the normal memory region signals NS1 through NSP are bit line signals of the normal memory region 151, respectively. The plurality of the redundant memory region signals RS1, RS2 through RSN may be bit line signals of the redundant memory region 152, respectively. For example, one of the bit line signals may be used to identify/address a column of the corresponding memory region.

Figure 2:
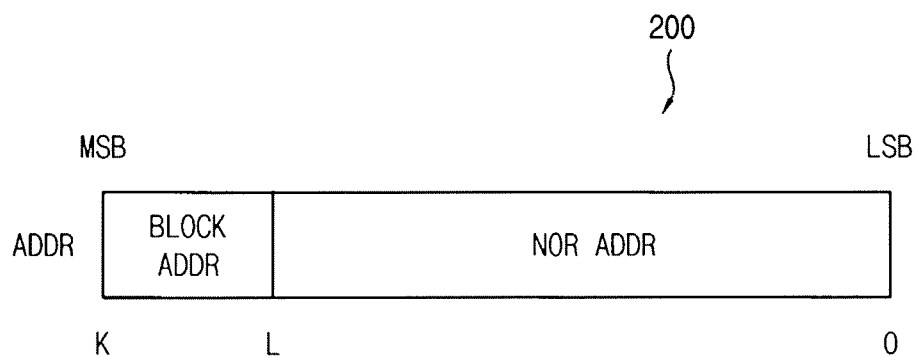
FIG. 2 is a block diagram illustrating how the normal memory region signal generator included in the memory device of FIG. 1 uses the address signal.

FIG. 2 is a block diagram illustrating how the normal memory region signal generator included in the memory device of FIG. 1 uses the address signal.

Referring to FIG. 2, the address signal ADDR 200 has K bits. K is a natural number. The normal memory region signal generator 120 uses upper bits ((L+1)-th bit through (K)-th bit) of the address signal ADDR as a block address BLOCK ADDR. L is a natural number less than K. The normal memory region signal generator 120 uses lower bits (first bit through (L)-th bit) of the address signal ADDR as a normal memory region address NOR ADDR. In FIG. 2, the MSB is illustrated as the left-most bit and the LSB is illustrated as the right-most bit having an index of 0.

Figure 3:
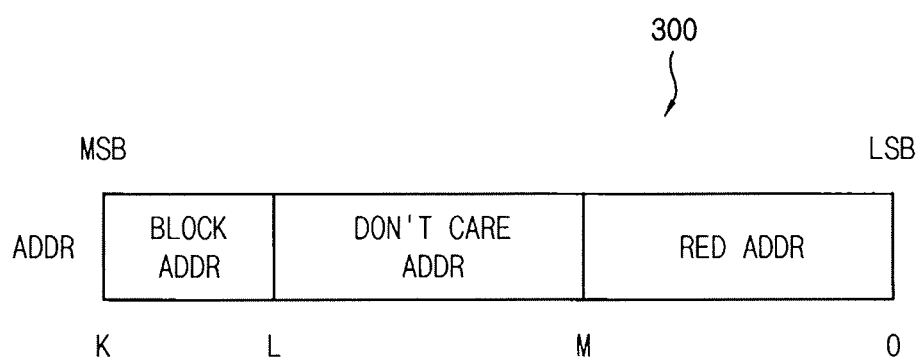
FIG. 3 is a block diagram illustrating how the redundant memory region signal generator included in the memory device of FIG. 1 uses the address signal.

FIG. 3 is a block diagram illustrating how the redundant memory region signal generator included in the memory device of FIG. 1 uses the address signal.

Referring to FIG. 3, the address signal ADDR 300 has K bits. The redundant memory region signal generator 130 uses upper bits ((L+1)-th bit through (K)-bit) of the address signal ADDR as the block address BLOCK ADDR. The redundant memory region signal generator 130 does not use middle bits ((M+1)-th bit through (L)-th bit) of the address signal ADDR. The middle bits may be referred to as a DON'T CARE ADDR as illustrated in FIG. 3. M is as natural number less than L. The redundant memory region signal generator 130 uses lower bits (first bit through (M)-th bit) of the address signal ADDR as a redundant memory region address RED ADDR. In FIG. 3, the MSB is illustrated as the left-most bit and the LSB is illustrated as the right-most bit having an index of 0.

Figure 4:
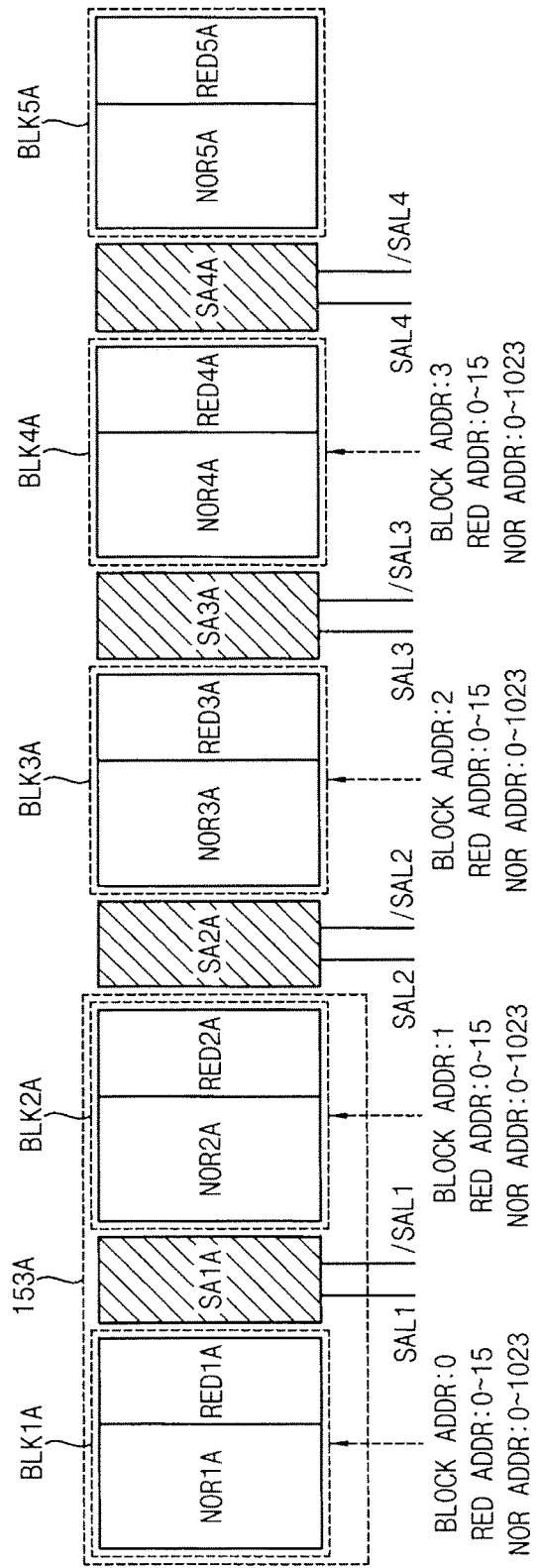
FIG. 4 is a block diagram illustrating an exemplary embodiment of the memory cell array included in the memory device of FIG. 1.

FIG. 4 is a block diagram illustrating an exemplary embodiment of the memory cell array included in the memory device of FIG. 1.

FIG. 4 shows the memory cell array 150A with K set to 13, L set to 10, and M set to 4.

In an exemplary embodiment, the memory cell array 150A includes a first block BLK1A, a second block BLK2A, a third block BLK3A, a fourth block BLK4A, a first sense amplifier SA1A, a second sense amplifier SA2A, a third sense amplifier SA3A, and a fourth sense amplifier SA4A.

The first block BLK1A includes a first normal memory sub-region NOR1A and a first redundant memory sub-region RED1A. The second block BLK2A includes a second normal memory sub-region NOR2A and a second redundant memory sub-region RED2A. The third block BLK3A includes a third normal memory sub-region NOR3A and a third redundant memory sub-region RED3A. The fourth block BLK4A includes the fourth normal memory sub-region NOR4A and a fourth redundant memory sub-region RED4A. A first circuit 153A may include the first block BLK1A, the second block BLK2A, and the first sense amplifier SA1A.

The normal memory region 151 may include the first normal memory sub-region NOR1A, the second normal memory sub-region NOR2A, the third normal memory sub-region NOR3A, and the fourth normal memory sub-region NOR4A. The redundant memory region 152 may include the first redundant memory sub-region RED1A, the second redundant memory sub-region RED2A, the third redundant memory sub-region RED3A, and the fourth redundant memory sub-region RED4A.

The first normal memory sub-region NOR1A corresponds to a case where the block address BLOCK ADDR is 0 and the normal memory region address NOR ADDR is from 0 to 1023, assuming a block size of 1024. The block size may be lower or higher than 1024 in alternate embodiments. The first redundant memory sub-region RED1A corresponds to a case where the block address BLOCK ADDR is 0 and the redundant memory region address RED ADDR is from 0 to 15. The second normal memory sub-region NOR2A corresponds to a case where the block address BLOCK ADDR is 1 and the normal memory region address NOR ADDR is from 0 to 1023. The second redundant memory sub-region RED2A corresponds to a case where the block address BLOCK ADDR is 1 and the redundant memory region address RED ADDR is from 0 to 15. The second normal memory sub-region NOR3A corresponds to a case where the block address BLOCK ADDR is 2 and the normal memory region address NOR ADDR is from 0 to 1023. The third redundant memory sub-region RED3A corresponds to a case where the block address BLOCK ADDR is 2 and the redundant memory region address RED ADDR is from 0 to 15. The fourth normal memory sub-region NOR4A corresponds to a case where the block address BLOCK ADDR is 3 and the normal memory region address NOR ADDR is from 0 to 1023. The fourth redundant memory sub-region RED4A corresponds to a case where the block address BLOCK ADDR is 3 and the redundant memory region address RED ADDR is from 0 to 15.

The first sense amplifier SA1A is disposed between the first block BLK1A and the second block BLK2A. The second sense amplifier SA2A is disposed between the second block BLK2A and the third block BLK3A. The third sense amplifier SA3A is disposed between the third block BLK3A and the fourth block BLK4A.

The first sense amplifier SA1A generates the data signal DATA by amplifying signals stored in the first normal memory sub-region NOR1A and the first redundant memory sub-region RED1A. The second sense amplifier SA2A generates the data signal DATA by amplifying signals stored in the second normal memory sub-region NOR2A and the second redundant memory sub-region RED2A. The third sense amplifier SA3A generates the data signal DATA by amplifying signals stored in the third normal memory sub-region NOR3A and the third redundant memory sub-region RED3A. The fourth sense amplifier SA4A generates the data signal DATA by amplifying signals stored in the fourth normal memory sub-region NOR4A and the fourth redundant memory sub-region RED4A.

The first normal memory region signals may correspond to the first through fourth normal memory sub-regions NOR1A, NOR2A, NOR3A, and NOR4A. The first redundant memory region signal may correspond to the first through fourth redundant memory sub-regions RED1A, RED2A, RED3A, and RED4A.

Figure 5:
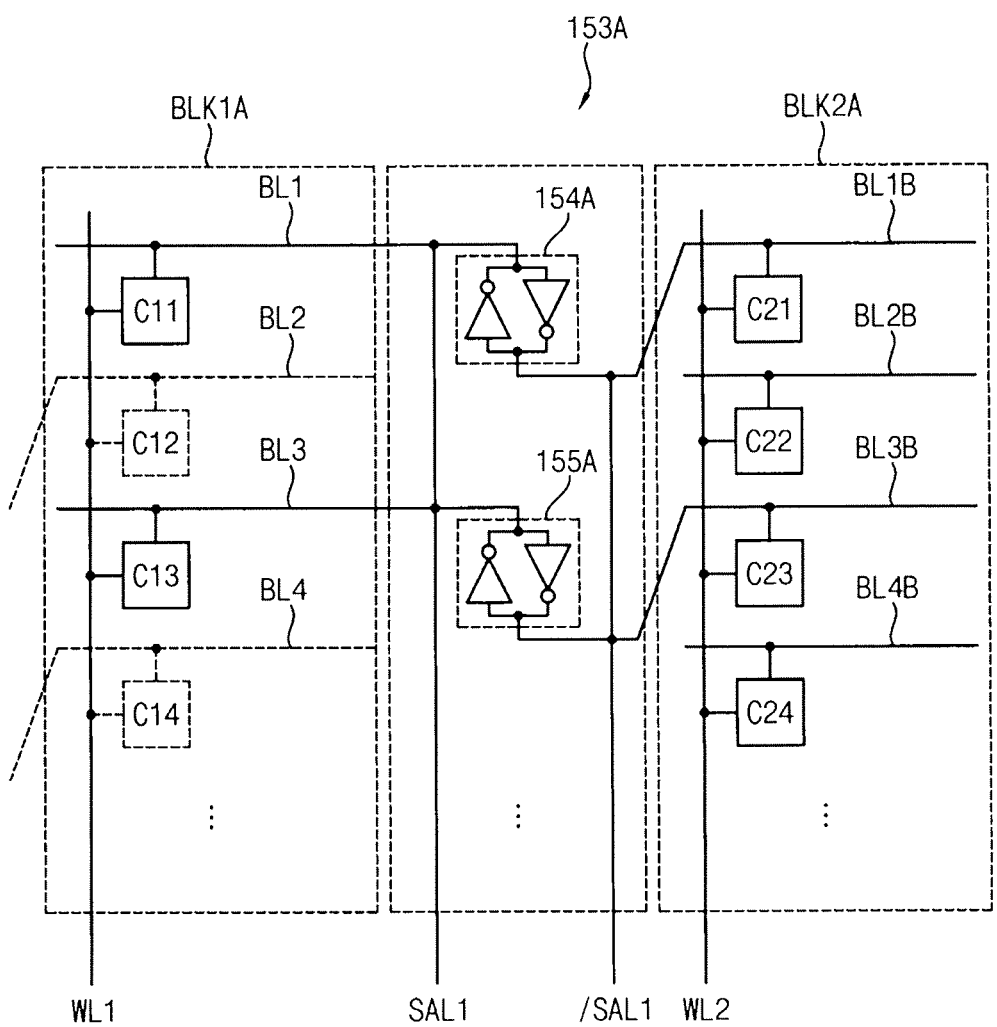
FIG. 5 is a circuit diagram illustrating the first circuit included in the memory cell array of FIG. 4.

FIG. 5 is a circuit diagram illustrating the first circuit included in the memory cell array of FIG. 4. The circuit diagram of FIG. 5 includes a first bit line BL1, a second bit line BL2, a third bit line BL3, a fourth bit line BL4, a first inverted bit line BL1B, a second inverted bit line BL2B, a third inverted bit line BL3B, and a fourth inverted bit line BL4B.

FIG. 5 shows a case where the memory cell array 150A of FIG. 4 further includes the fifth block BLK5A. The fifth block BLK5A may include the fifth normal memory sub-region NOR5A and the fifth redundant memory sub-region RED1A.

The first block BLK1A includes a first memory cell C11 and a fifth memory cell C13. The second block BLK2A includes a second memory cell C21, a fourth memory cell C22, a sixth memory cell C23, and an eighth memory cell C24.

When the first word line WL1 and the first bit line BL1 connected to the first memory cell C11 are activated, and the second word line WL2 connected to the second memory cell C21 is deactivated, and the first inverted bit line BL1B connected to the second memory cell C21 is activated, the first sense amplifying cell 154A included in the first sense amplifier SA1A generates output signals SAL1, /SAL1 by amplifying a data signal of the first memory cell C11 based on a reference signal of the second memory cell C21 corresponding to the first memory cell C11.

When the first word line WL1 and the third bit line BL3 connected to the fifth memory cell C13 are activated, and the second word line WL2 connected to the sixth memory cell C23 is deactivated, and the third inverted bit line BL3B connected to the sixth memory cell C23 is activated, the second sense amplifying cell 155A included in the first sense amplifier SA1A generates output signals SAL1, /SAL1 by amplifying a data signal of the fifth memory cell C13 based on a reference signal of the sixth memory cell C23 corresponding to the fifth memory cell C13.

The second sense amplifier SA2A generates output signals SAL2, /SAL2 by amplifying data signals of the fourth and eighth memory cells C22, C24 included in the first block BLK1A based on a reference signals of the second block BLK2A. The third sense amplifier SA3A generates outputs signals SAL3, /SAL3 as shown in FIG. 4.

If the third and seventh memory cells C12, C14 are included in the first block BLK1A, because the reference signal does not exist on the left side of the first block BLK1A, data signals of the third and seventh memory cells C12, C14 are not amplified by the sense amplifier. The third and seventh memory cells C12, C14 may be disposed not in the first block BLK1A but in the fifth block BLK5A. The fourth sense amplifier SA4A generates output signals SAL4, /SAL4 by amplifying data signals of the third and seventh memory cells C12, C14 based on the reference signal of the fourth block BLK4A.

The second block BLK2A, the third block BLK3A, and the fourth block BLK4A may have a configuration similar to the first BLK1A based on the above description of BLK1A.

In an exemplary embodiment, data, which are stored in the first, third, and the fifth blocks BLK1A, BLK3A, and BLK5A, and data, which are stored in the second and the fourth blocks BLK2A and BLK4A, have an opposite logical level from each other. In an exemplary embodiment, if the first normal memory region signals correspond to the first normal memory sub-region NOR1A, the first redundant memory region signal corresponds to the first, third, and fifth redundant memory sub-regions RED1A, RED3A, and RED5A, and do not correspond to the second and fourth redundant memory sub-regions RED2A and RED4A. In an exemplary embodiment, if the first normal memory region signals correspond to the second normal memory sub-region NOR2A, the first redundant memory region signal corresponds to the second and fourth redundant memory sub-regions RED2A and RED4A, and do not correspond to the first, third, and fifth redundant memory sub-regions RED1A, RED3A, and RED5A. Other cases may be understood based on the description.

Figure 6:
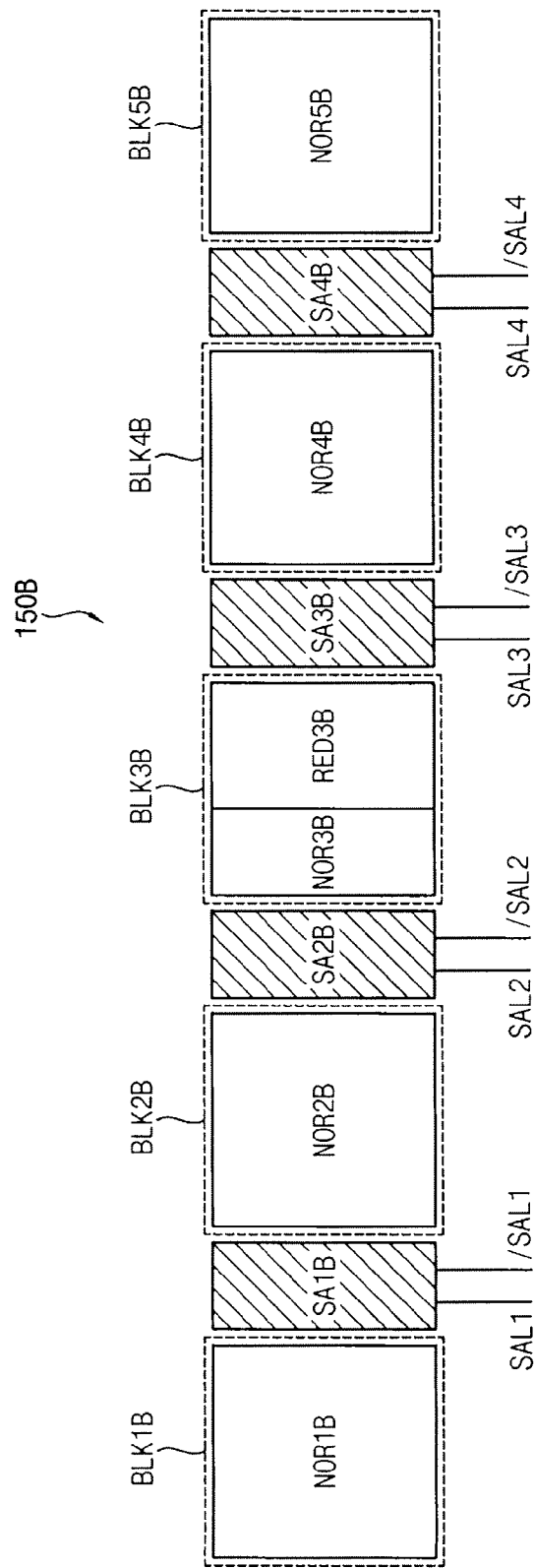
FIG. 6 is block diagram illustrating an exemplary embodiment of the memory cell array included in the memory device of FIG. 1.

FIG. 6 is block diagram illustrating an exemplary embodiment of the memory cell array included in the memory device of FIG. 1.

The memory cell array 150B of FIG. 6 has the same or similar structure with the memory cell array 150A of FIG. 4 except for the location of the redundant memory sub-region.

The first block BLK1B includes the first normal memory sub-region NOR1B. The second block BLK2B includes the second normal memory sub-region NOR2B. The third block BLK3B includes the third normal memory sub-region NOR3B and redundant memory sub-region RED3B. The fourth block BLK4B includes the fourth normal memory sub-region NOR4B. The fifth block BLK5B includes the fifth normal memory sub-region NOR5B.

The first normal memory region signals may correspond to the first through fifth normal memory sub-regions NOR1B, NOR2B, NOR3B, NOR4B, and NOR5B. The first redundant memory region signal may correspond to redundant memory sub-region RED3B.

Figure 7:
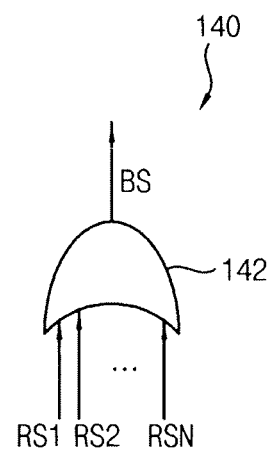
FIG. 7 is a block diagram illustrating the block signal generator included in the memory device of FIG. 1.

FIG. 7 is a block diagram illustrating the block signal generator included in the memory device of FIG. 1.

Referring to FIG. 7, the block signal generator 140 includes the logical OR operation unit 142 (e.g., an OR gate). The logical OR operation unit 142 may output a logical OR operation result of the plurality of the redundant memory region signals RS1, RS2 through RSN as a block signal BS.

Figure 8:
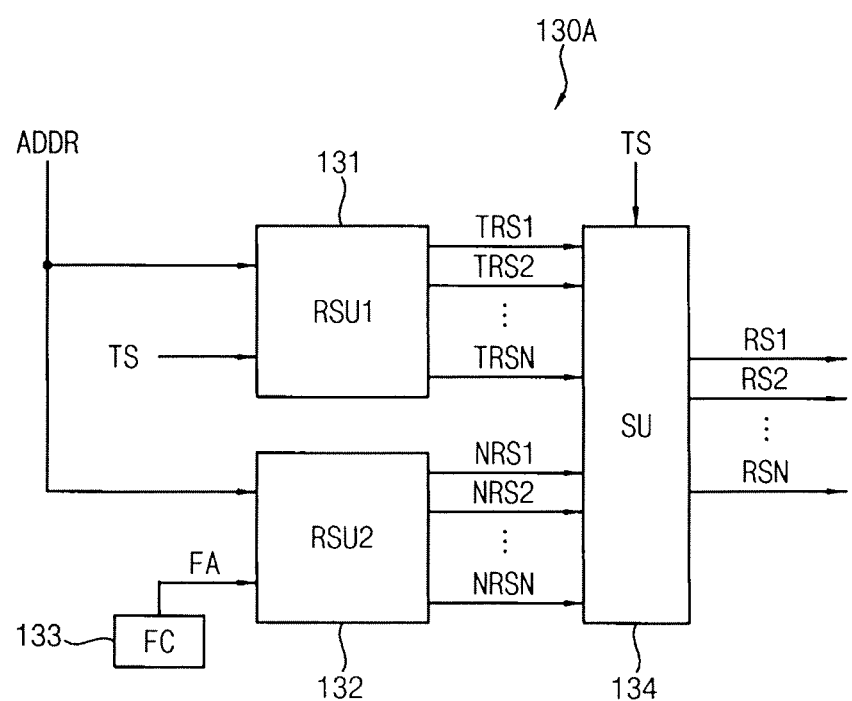
FIG. 8 is a block diagram illustrating an exemplary embodiment of the redundant memory region signal generator included in the memory device of FIG. 1.

FIG. 8 is a block diagram illustrating an exemplary embodiment of the redundant memory region signal generator included in the memory device of FIG. 1.

Referring to FIG. 8, the redundant memory region signal generator 130A includes a first redundant memory region signal generation unit RSU1 131, a second redundant memory region signal generation unit RSU2 132, and a selection unit SU 134.

The first redundant memory region signal generation unit 131 generates first internal redundant memory region signals TRS1, TRS2 through TRSN which are activated once respectively while the plurality of the normal memory region signals NS1 through NSP are activated once respectively based on the address signal ADDR. The second redundant memory region signal generation unit 132 generates second internal redundant memory region signals NRS1, NRS2 through NRSN by comparing a value of the address signal ADDR and faulty address values FA stored in a fuse circuit FC133. The selection unit 134 outputs the first internal redundant memory region signals TRS1, TRS2 through TRSN as the plurality of the redundant memory region signals RS1, RS2 through RSN when the test signal TS has a first logic state (e.g., a logical high level). The selection unit 134 outputs the second internal redundant memory region signals NRS1, NRS2 through NRSN as the plurality of the redundant memory region signals RS1, RS2 through RSN when the test signal TS has a second logic state (e.g., a logical low level) different than the first logic state.

Figure 9:
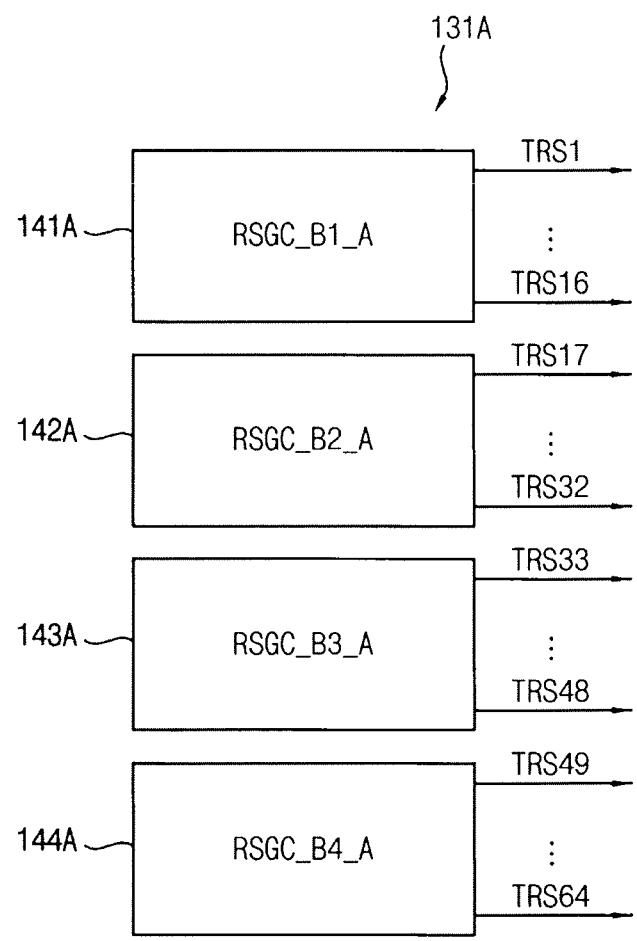
FIG. 9 is a block diagram illustrating an exemplary embodiment of the first redundant memory region signal generation unit included in the redundant memory region signal generator of FIG. 8.

FIG. 9 is a block diagram illustrating an exemplary embodiment of the first redundant memory region signal generation unit included in the redundant memory region signal generator of FIG. 8.

FIG. 9 shows the first redundant memory region signal generation unit 131A when N is 64 and the memory cell array 150 has the structure of FIG. 4. The first redundant memory region signal generation unit 131A includes the first block signal generation circuit RSGC_B1_A 141A, the second block signal generation circuit RSGC_B2_A 142A, the third block signal generation circuit RSGC_B3_A 143A, and the fourth block signal generation circuit RSGC_B4_A 144A.

The first internal redundant memory region signals TRS1, TRS2 through TRSN of FIG. 8 includes the first block signals TRS1 through TRS16, the second block signals TRS17 through TRS32, the third block signals TRS33 through TRS48, and the fourth block signals TRS49 through TRS64. The first block signal generation circuit 141A outputs the first block signals TRS1 through TRS16 corresponding to the first block BLK1A. The second block signal generation circuit 142A outputs the second block signals TRS17 through TRS32 corresponding to the second block BLK2A. The third block signal generation circuit 143A outputs the third block signals TRS33 through TRS48 corresponding to the third block BLK3A. The fourth block signal generation circuit 144A outputs the fourth block signals TRS49 through TRS64 corresponding to the fourth block BLK4A.

Figure 10:
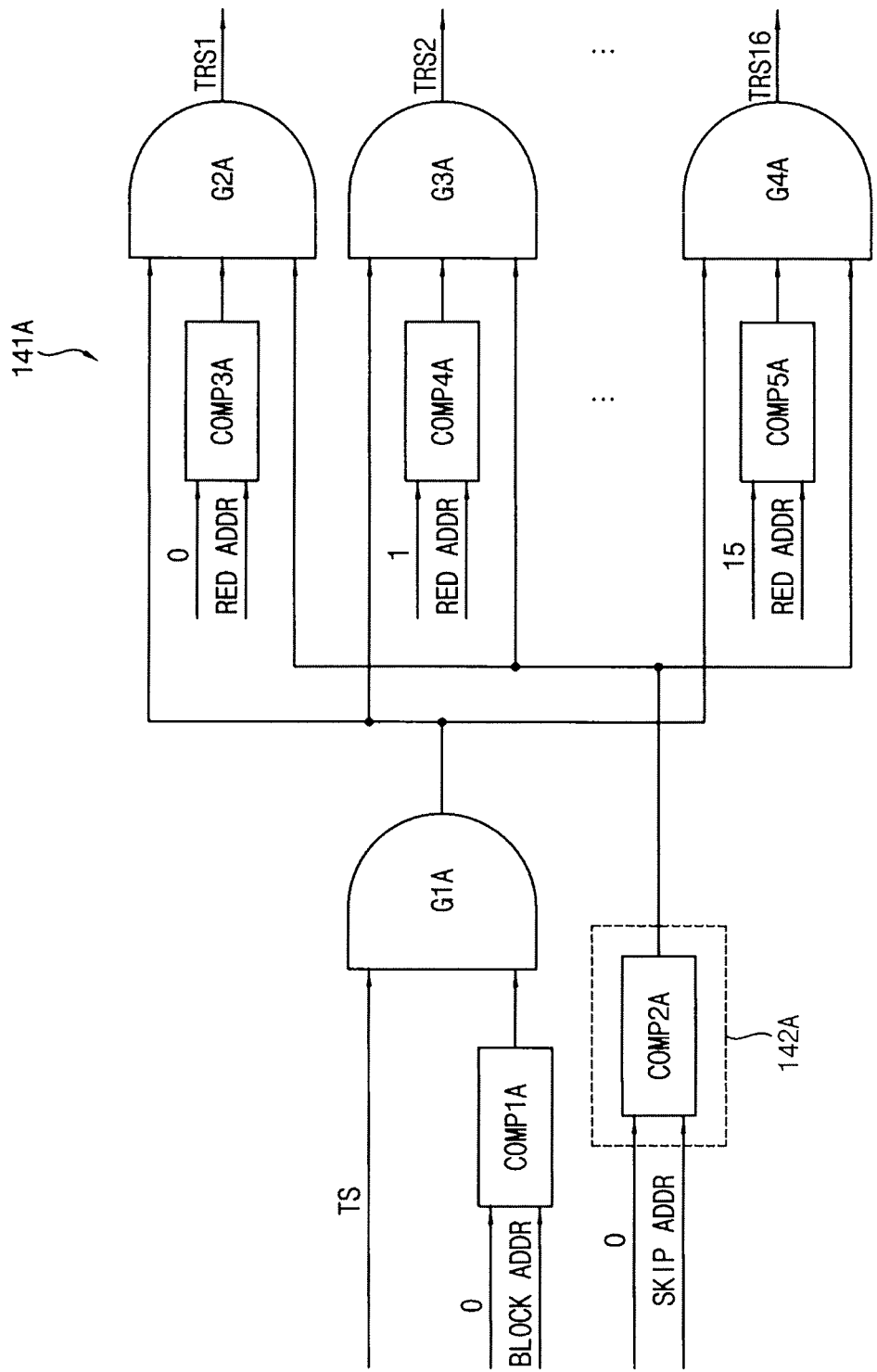
FIG. 10 is a block diagram illustrating the first block signal generation circuit included in the first redundant memory region signal generation unit of FIG. 9.

FIG. 10 is a block diagram illustrating the first block signal generation circuit included in the first redundant memory region signal generation unit of FIG. 9.

Referring to FIG. 10, the first block signal generation circuit 141A includes an activation frequency controller 142A, a first AND gate G1A, a second AND gate G2A, a third AND gate G3A, a fourth AND gate G4A, a first comparator COMP1A, a third comparator COMP3A, a fourth comparator COMP4A, and a fifth comparator COMP5A. The activation frequency controller 142A includes the second comparator COMP2A.

In FIGS. 2 and 3, when K is 13, L is 10, and M is 4, and the normal memory region signal generator 120 uses the third, fifth, sixth, eighth, and ninth bits RA2, RA4, RA5, RA7, and RA8 of the address signal ADDR as a don't care address to activate five signals among the plurality of the normal memory region signals NS1 through NSP of FIG. 1 simultaneously as the first normal memory region signals, the normal memory region signal generator 120 substantially uses first, second, fourth, seventh, and tenth bits RA0, RA1, RA3, RA6, and RA9 of the address signal ADDR, and the redundant memory region signal generator 130 substantially uses first, second, and fourth bits RA0, RA1, and RA3 of the address signal ADDR. If the memory cell array 150 is tested with the address signal ADDR increased from 0 to 1023 sequentially, there is a problem that the redundant memory region 152 is tested four times more than the normal memory region 151.

The activation frequency controller 142A deactivates the first block signals TRS1 through TRS16 when a portion SKIP ADDR of the address signal ADDR is different from a user pre-determined value (e.g., 0). In an exemplary embodiment, if the portion SKIP ADDR of the address signal ADDR is set to seventh and tenth bits RA6, RA9 of the address signal ADDR, and the first block signals TRS1, TRS2 through TRS16 are activated when the seventh and tenth bits RA6, RA9 of the address signal ADDR has the user pre-determined value (e.g., 0), the normal memory region 151 and the first block BLK1A are tested with the same frequency. The user pre-determined value may be a natural number other than 0.

The first comparator COMP1A outputs a logical high level when the block address BLOCK ADDR is 0. The first comparator COMP1A outputs a logical low level when the block address BLOCK ADDR has a number other than 0. The first gate G1A outputs a result of a logical AND operation of the test signal TS and an output signal of the first comparator COMP1A. The second comparator COMP2A outputs a logical high level when the portion SKIP ADDR of the address signal ADDR is 0. The second comparator COMP2A outputs a logical low level when the portion SKIP ADDR of the address signal ADDR is a number other than 0. The third comparator COMP3A outputs a logical high level when the redundant memory region address RED ADDR is 0. The third comparator COMP3A outputs a logical low level when the redundant memory region address RED ADDR is a number other than 0. The second gate G2A outputs a logical AND result of an output signal of the first gate G1A, an output signal of the third comparator COMP3A, and an output signal of the second comparator COMP2A, as the first block internal signal TRS1. The fourth comparator COMP4A outputs a logical high level when the redundant memory region address RED ADDR is 1. The fourth comparator COMP4A outputs a logical low level when the redundant memory region address RED ADDR is a number other than 1. The third gate G3A outputs a result of a logical AND operation of an output signal of the first gate signal G1A, an output signal of the fourth comparator COMP4A, and an output signal of the second comparator COMP2A as the second block internal signal TRS2. The fifth comparator COMP5A outputs a logical high level when the redundant memory region address RED ADDR is 15. The fifth comparator COMP5A outputs a logical low level when the redundant memory region address RED ADDR is a number other than 15. The fourth gate G4A outputs a result of a logical AND operation of an output signal of the first gate signal G1A, an output signal of the fifth comparator COMP5A, and an output signal of the second comparator COMP2A as the sixteenth block internal signal TRS16.

Figure 11:
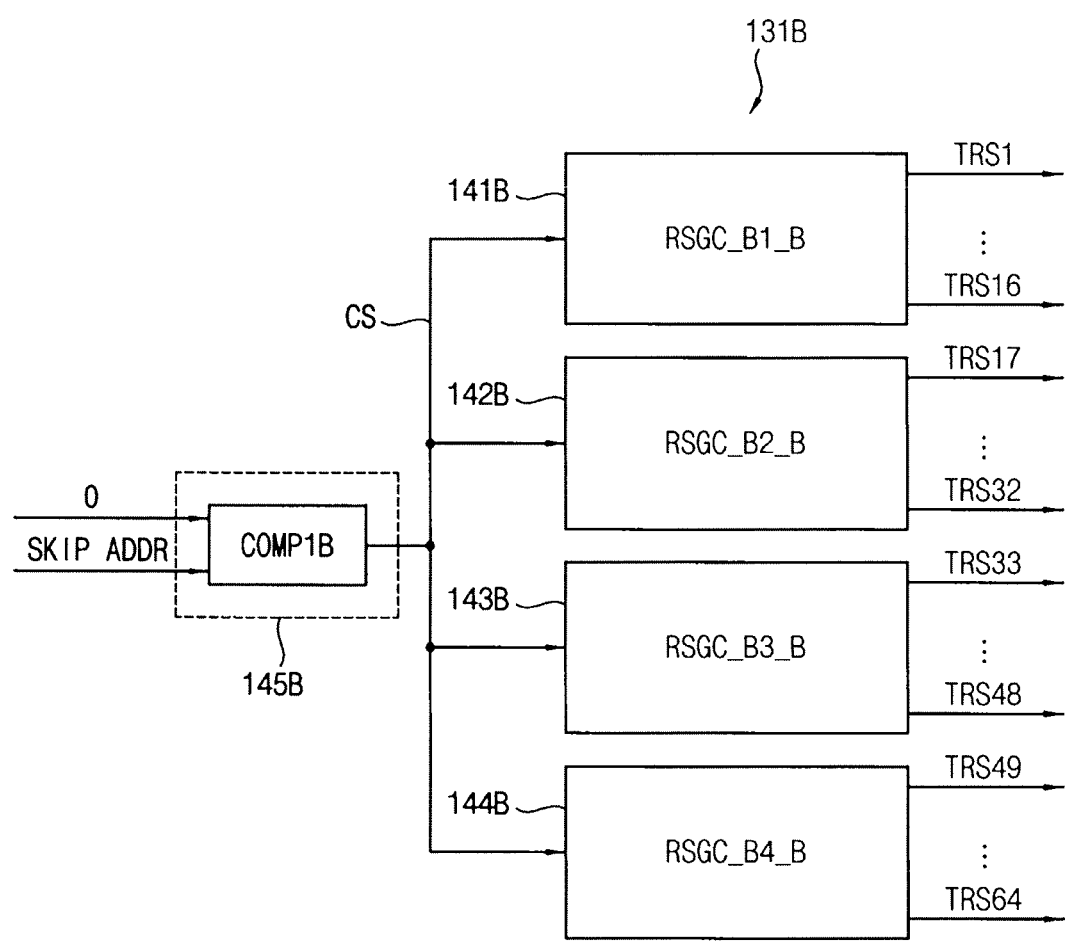
FIG. 11 is a block diagram illustrating an exemplary embodiment of the first redundant memory region signal generation unit included in the redundant memory region signal generator of FIG. 8.

FIG. 11 is a block diagram illustrating an exemplary embodiment of the first redundant memory region signal generation unit included in the redundant memory region signal generator of FIG. 8.

FIG. 11 shows the first redundant memory region signal generation unit 131B when N is 64 and the memory cell array 150 has the structure of FIG. 4. The first redundant memory region signal generation unit 131B includes the first block signal generation circuit RSGC_B1_B 141B, the second block signal generation circuit RSGC_B2_B 142B, the third block signal generation circuit RSGC_B3_B, the fourth block signal generation circuit RSGC_B4_B 144B, and the activation frequency controller 145B.

The activation frequency controller 145B outputs a result of comparing the portion SKIP ADDR of the address signal ADDR and the user pre-determined value (e.g., 0) as the compared signal CS. The user pre-determined value may be a natural number other than 0. The activation frequency controller 145B includes the first comparator COMP1B. The first comparator COMP may output a logical high level as the compared signal CS when the portion SKIP ADDR of the address signal ADDR is 0. The first comparator COMP1B may output a logical low level as the compared signal CS when the portion SKIP ADDR of the address signal ADDR is a number other than 0.

The first block signal generation circuit 141B outputs the first block signals TRS1 through TRS16 corresponding to the first block BLK1A based on the compared signal CS. The second block signal generation circuit 142B outputs the second block signals TRS17 through TRS32 corresponding to the second block BLK2A based on the compared signal CS. The third block signal generation circuit 143B outputs the third block signals TRS33 through TRS48 corresponding to the third block BLK3A based on the compared signal CS. The fourth block signal generation circuit 144B outputs the fourth block signals TRS49 through TRS64 corresponding to the fourth block BLK4A based on the compared signal CS.

Figure 12:
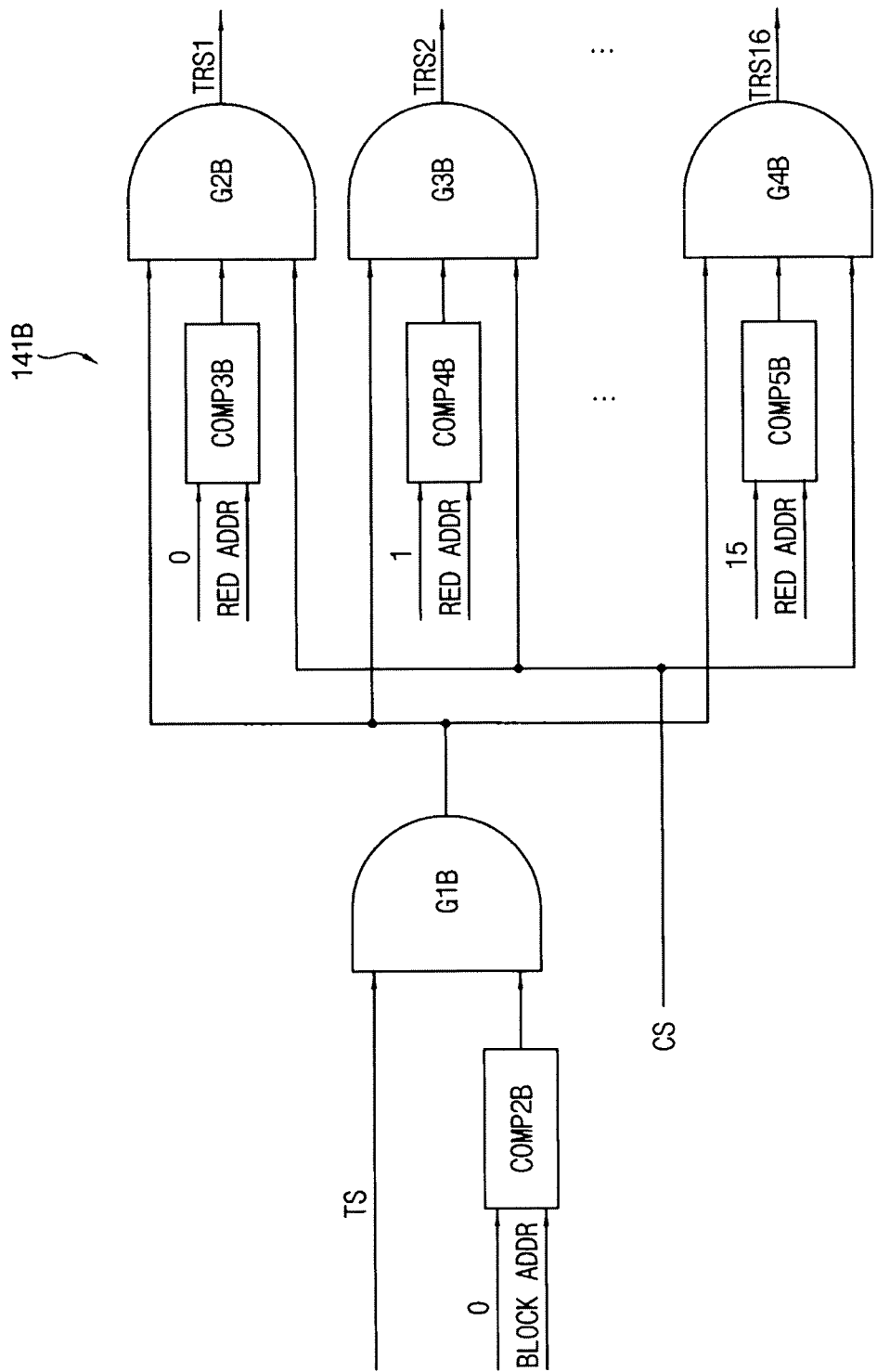
FIG. 12 is a block diagram illustrating the first block signal generation circuit included in the first redundant memory region signal generation unit of FIG. 11.

FIG. 12 is a block diagram 141B illustrating the first block signal generation circuit included in the first redundant memory region signal generation unit of FIG. 11. The block diagram 141B includes a first gate G1B, a second gate G2B, a third gate G3B, and a fourth gate G4B.

Referring to FIG. 12, the second comparator COMP2B outputs a logical high level when the block address BLOCK ADDR is 0. The second comparator COMP2B may output the logical low level when the block address BLOCK ADDR is a number other than 0. The first gate G1B outputs a result of a logical AND operation of the test signal TS and an output signal of the second comparator COMP2B. The third comparator COMP3B outputs a logical high level when the redundant memory region address RED ADDR is 0. The third comparator COMP3B may output the logical low level when the redundant memory region address RED ADDR is a number other than 0. The second gate G2B outputs a logical AND result of an output signal of the first gate G1B, an output signal of the third comparator COMP3B, and the compared signal CS, as the first block internal signal TRS1. The fourth comparator COMP4B outputs a logical high level when the redundant memory region address RED ADDR is 1. The fourth comparator COMP4B may output the logical low level when the redundant memory region address RED ADDR is a number other than 1. The third gate G3B outputs a result of a logical AND operation of an output signal of the first gate signal G1B, an output signal of the fourth comparator COMP4B, and the compared signal CS as the second block internal signal TRS2. The fifth comparator COMP5B outputs a logical high level when the redundant memory region address RED ADDR is 15. The fifth comparator COMP5B may output the logical low level when the redundant memory region address RED ADDR is a number other than 15. The fourth gate G4B outputs a result of a logical AND operation of an output signal of the first gate signal G1B, an output signal of the fifth comparator COMP5B, and the compared signal CS as the sixteenth block internal signal TRS16.

Figure 13:
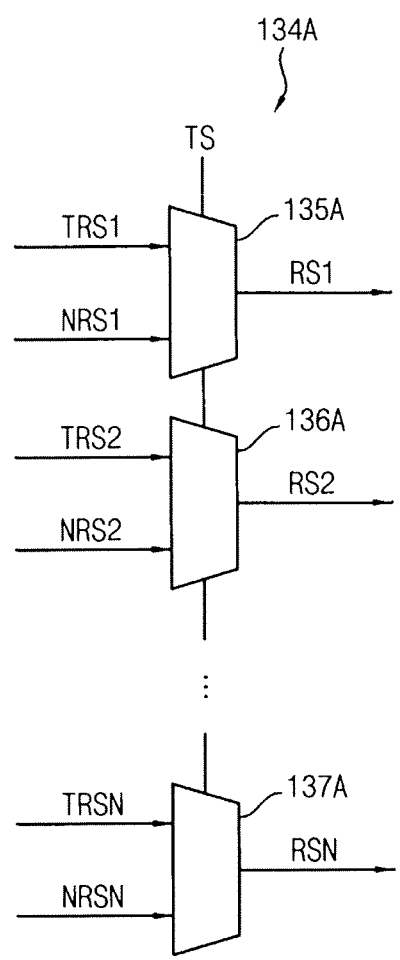
FIG. 13 is a block diagram illustrating an exemplary embodiment of the selection unit included in the redundant memory region signal generator of FIG. 8.

FIG. 13 is a block diagram illustrating an exemplary embodiment of the selection unit included in the redundant memory region signal generator of FIG. 8.

Referring to FIG. 13, the selection unit 134A includes multiplexers 135A, 136A, and 137A. The multiplexers 135A, 136A, and 137A may output the first internal redundant memory region signals TRS1, TRS2 through TRSN as the plurality of the redundant memory region signals RS1, RS2 through RSN when the test signal TS has a logical high level. The multiplexers 135A, 136A, and 137A may output the second internal redundant memory region signals NRS1, NRS2 through NRSN as the plurality of the redundant memory region signals RS1, RS2 through RSN when the test signal TS has a logical low level.

Figure 14:
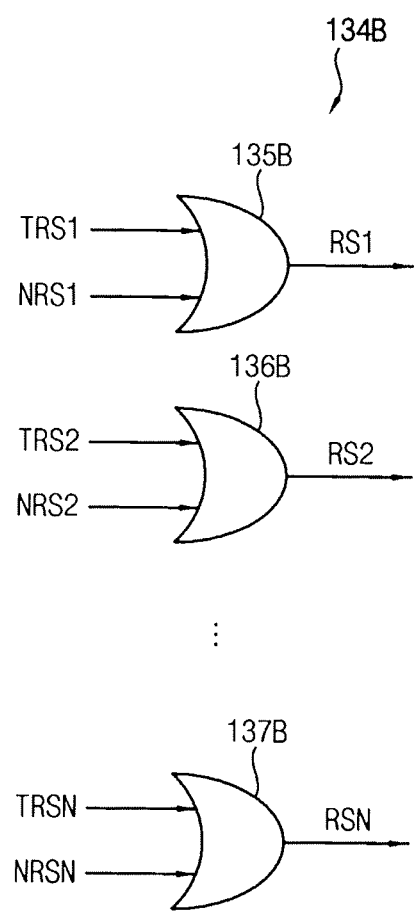
FIG. 14 is a block diagram illustrating an exemplary embodiment of the selection unit included in the redundant memory region signal generator of FIG. 8.

FIG. 14 is a block diagram illustrating an exemplary embodiment of the selection unit included in the redundant memory region signal generator of FIG. 8.

Referring to FIG. 14, the selection unit 134B includes logical OR gates 135B, 136B, and 137B. The logical OR gates 135B, 136B, and 137B output the plurality of the redundant memory region signals RS1, RS2 through RSN by executing logical OR operation on the first internal redundant memory region signals TRS1, TRS2 through TRSN and the second internal redundant memory region signals NRS1, NRS2 through NRSN for respective bits.

Figure 15:
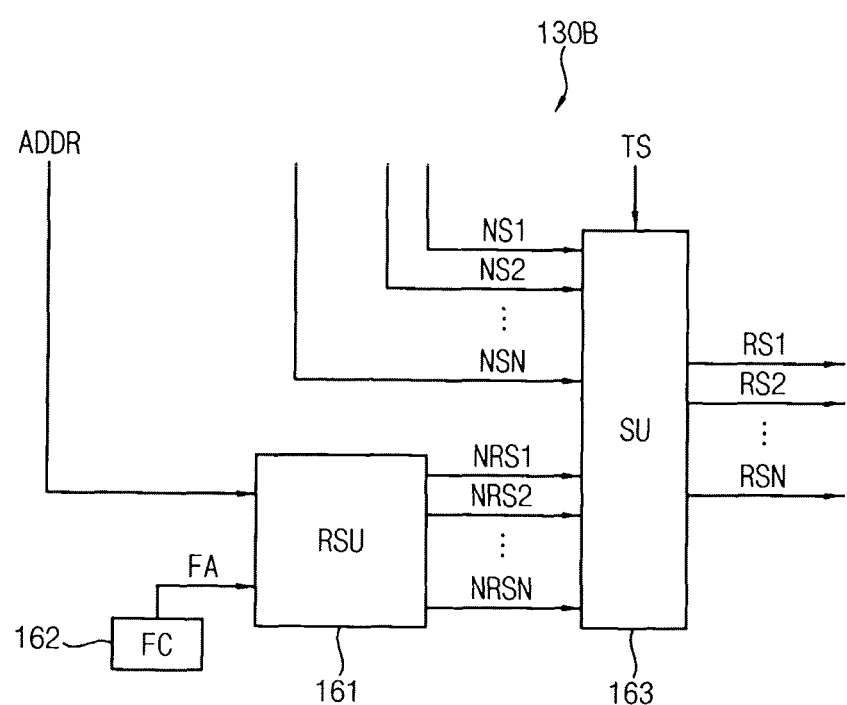
FIG. 15 is a block diagram illustrating an exemplary embodiment of the redundant memory region signal generator included in the memory device of FIG. 1.

FIG. 15 is a block diagram illustrating an exemplary embodiment of the redundant memory region signal generator included in the memory device of FIG. 1.

Referring to FIG. 15, the redundant memory region signal generator 130B includes a redundant memory region signal generation unit RSU 161, and a selection unit SU 163. The redundant memory region signal generation unit RSU 161 generates internal redundant memory region signals NRS1, NRS2 through NRSN by comparing a value of the address signal ADDR and faulty address values FA stored in a fuse circuit FC 162. The selection unit 163 may output a portion NS1, NS2 through NSN of the plurality of the normal memory region signals NS1, NS2 through NSP as the plurality of the redundant memory region signals RS1, RS2 through RSN when the test signal TS has a logical high level. The selection unit SU may output the internal redundant memory region signals NRS1, NRS2 through NRSN as the plurality of the redundant memory region signals RS1, RS2 through RSN when the test signal TS has a logical low level.

In an exemplary embodiment, the selection unit 163 receives another portion of the plurality of the normal memory region signals NS1, NS2 through NSP instead of the portion NS1, NS2 through NSN of the normal memory region signals NS1, NS2 through NSP.

Figure 16:
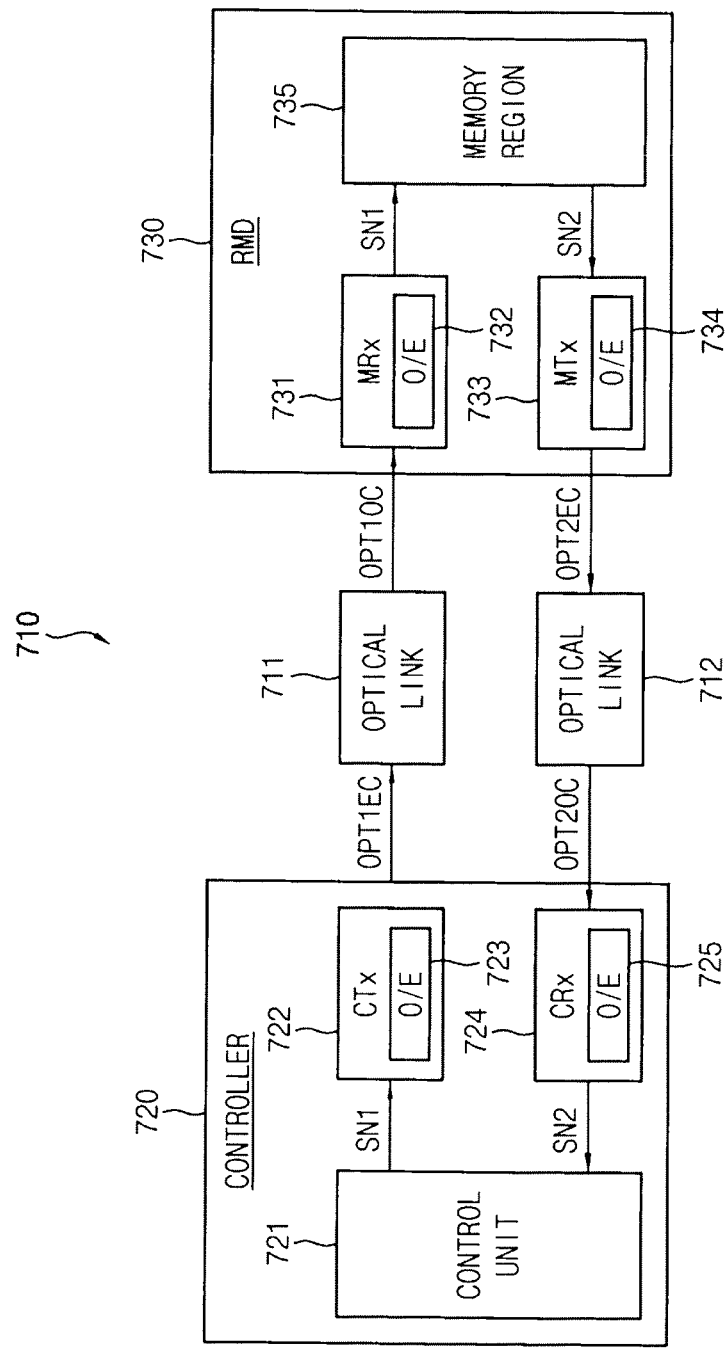
FIG. 16 is a block diagram illustrating the memory system including the memory device according to an exemplary embodiment of the inventive concept.

FIG. 16 is a block diagram illustrating the memory system including a memory device according to an exemplary embodiment of the inventive concept.

Referring to FIG. 16, a memory system 710 includes optical links 711 and 712, a controller 720 and a resistive memory device 730 ('RMD'). The optical links 711 and 712 may interconnect the controller 720 and the resistive memory device 730. The optical links 711 may be telecommunications links that consist of a single end-to-end optical circuit (e.g., a cable of optical fiber). For example, the resistive memory device 730 may include a resistive random-access memory.

The controller 720 includes a control unit 721, a first transmitter 722 ('CTx'), and a first receiver 724 ('CRx'). The control unit 721 transmits a first electrical signal SN1 to the first transmitter 722. The first electrical signal SN1 may include commands, clock signals, addresses and/or write data to be transmitted to the resistive memory device 730.

The first transmitter 722 includes a first optical modulator 723 ('O/E'). The first optical modulator 723 converts the first electrical signal SN1 into a first optical transmission signal OTP1EC and transmits the first optical transmission signal OTP1EC to the optical link 711. The first optical transmission signal OTP1EC may be transmitted by serial communication through the optical link 711. The first receiver 724 includes a first optical demodulator 725 ('O/E'). The first optical demodulator 725 converts a second optical reception signal OPT2OC received from the optical link 712 into a second electrical signal SN2 and transmits the second electrical signal SN2 to the control unit 721.

The resistive memory device 730 includes a second receiver 731 ('MRx'), a memory region 735 including Spin-Transfer Torque Magnetoresistive random-access memory STT-MRAM cells and a second transmitter 733 ('MTx'). The second receiver 731 includes a second optical demodulator 732 ('O/E'). The second optical demodulator 732 converts the first optical reception signal OPT1OC received from the optical link 711 into the first electrical signal SN1 and transmits the first electrical signal SN1 to the memory region 735.

Write data may be stored into the memory region 735 in response to the first electrical signal SN1, or read data retrieved from the memory region 735 may be transmitted as the second electrical signal SN2 to the second transmitter 733. The second electrical signal SN2 may include clock signals and/or read data transmitted to the memory controller 720. The second transmitter 733 may include a second optical modulator 734. The second optical modulator 734 converts the second electrical signal SN2 into the second optical data signal OPT2EC and transmits the second optical data signal OPT2EC to the optical link 712. The second optical transmission signal OPT2EC may be transmitted by serial communication through the optical link 712. The memory region 735 may be embodied by the memory device 100 of FIG. 1. The structure of the memory region 735 may be understood based on the references to FIGS. 1 through 15.

Figure 17:
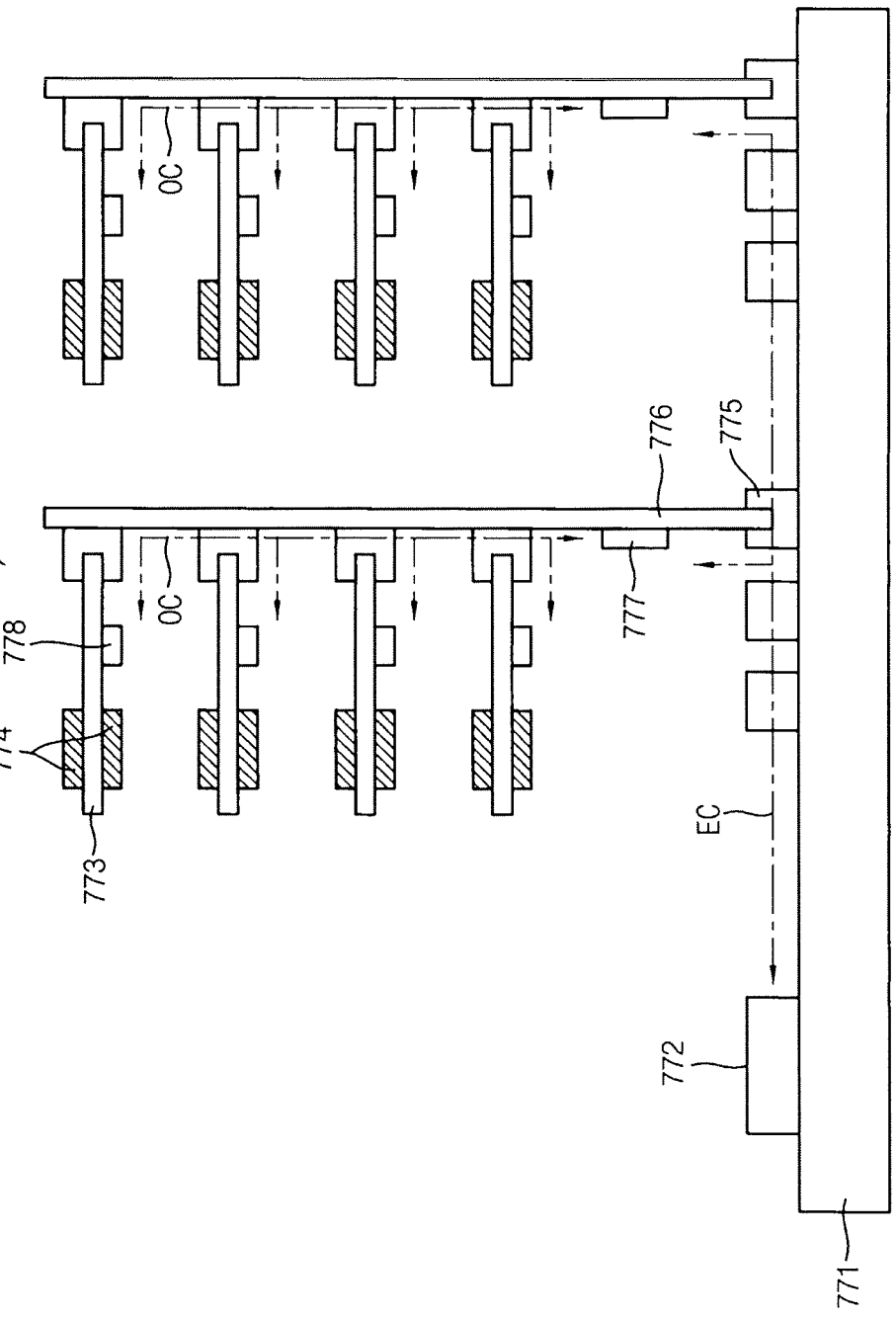
FIG. 17 is a block diagram illustrating a server system including the memory device according to an exemplary embodiment of the inventive concept.

FIG. 17 is a block diagram illustrating a server system including a memory device according to an exemplary embodiment of the inventive concept.

Referring to FIG. 17, a server system 770 includes a memory controller 772 and a plurality of memory modules 773. Each of the memory modules 773 includes a plurality of resistive memory devices 774. The resistive memory devices 774 may include a memory cell array having resistive memory cells or dynamic memory cells. Each of the memory modules 773 may be embodied by the memory device 100 of FIG. 1.

In the server system 770, each of second circuit boards 776 are connected to each of sockets 775 on a first circuit board 771. The server system 770 may be designed to have a channel structure in which one second circuit board 776 is connected to the first circuit board 771 according to signal channels.

In the server system 770, signals may be transmitted to and/or from the memory modules 773 via optical I/O connections. To form the optical I/O connection, the server system 770 may further include an electric-to-optical conversion unit 777, and the memory modules 773 may further include an optical-to-electrical conversion unit 778.

The memory controller 772 may be connected to the electric-to-optical conversion unit 777 through an electrical channel EC. The electric-to-optical conversion unit 777 may convert an electrical signal received from the memory controller 772 through the electrical channel EC into an optical signal and may transmit the optical signal to an optical channel OC. Also, the electric-to-optical conversion unit 777 may convert an optical signal received through the optical channel OC into an electrical signal and may transmit the electrical signal to the electrical channel EC.

The memory module 773 may be connected to the electric-to-optical conversion unit 777 through the optical channel OC. An optical signal applied to the memory module 773 may be converted into an electrical signal through the optical-to-electric conversion unit 778 and may be transmitted to the resistive type memory chips 774. The server system 770 including the optical connection memory modules may support high storage capacity and a high processing speed.

Figure 18:
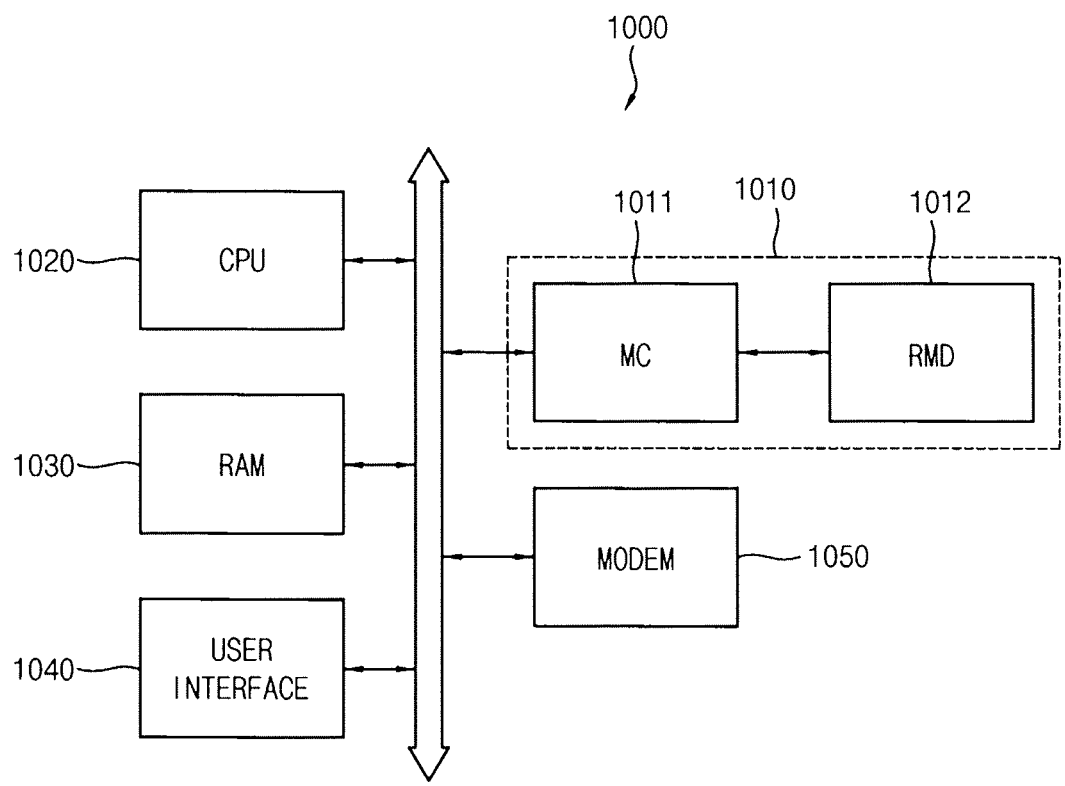
FIG. 18 is a block diagram illustrating a computing system including the memory device according to an exemplary embodiment of the inventive concept.

FIG. 18 is a block diagram illustrating a computing system including a memory device according to an exemplary embodiment of the inventive concept.

Referring to FIG. 18, a computing system 1000 includes a memory system 1010, a central processing unit (CPU) 1020, a RAM 1030, a user interface 1040 and a modem 1050 such as a baseband chipset. The computing system 1000 may further include an application chipset, a camera image processor (CIS), and/or an I/O device.

The user interface 1040 may be an interface for transmitting data to a communication network or receiving data from the communication network. The user interface 1040 may have a wired or wireless form, and may include an antenna or a wired/wireless transceiver. Data applied through the user interface 1040 or the modem 1050 or processed by the CPU 1020 may be stored in the memory system 1010.

The memory system 1010 may include a memory device 1012 ('RMD') and a memory controller 1011. Data, processed by the CPU 1020 or inputted from the outside, may be stored in the memory device 1012. The memory device 1012 may be embodied by the memory device 100 of FIG.

1. The memory device 1012 may be understood based on the references to FIGS. 1 through 15.

When the computing system 1000 is a device that performs wireless communications, the computing system 1000 may be used in a communication system such as code division multiple access (CDMA), global system for mobile communication (GSM), North American multiple access (NADC), or CDMA2000. The computing system 1000 may be mounted on an information processing device such as a personal digital assistant (PDA), a portable computer, a web tablet, a digital camera, a portable media player (PMP), a mobile phone, a wireless phone, or a laptop computer.

Figure 19:
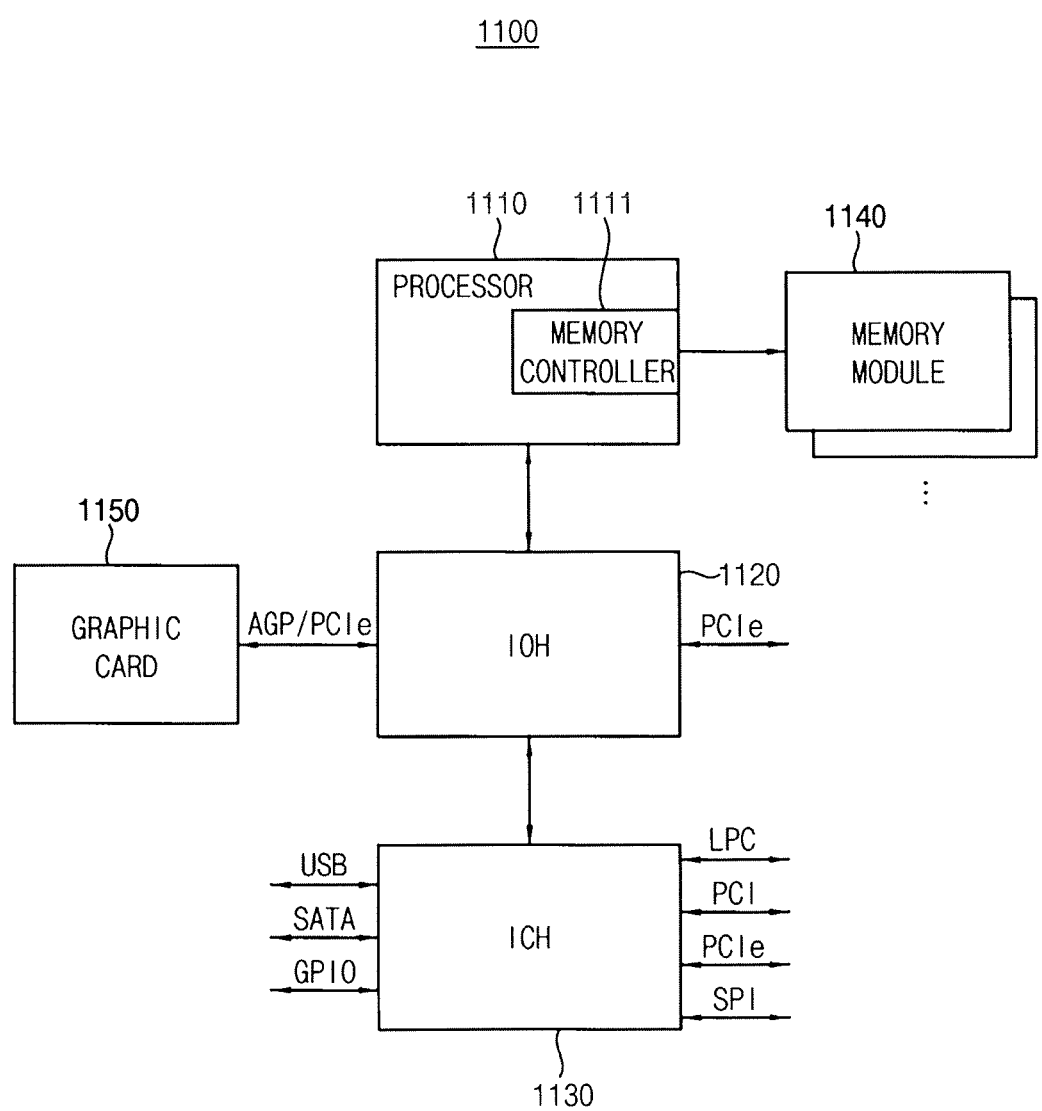
FIG. 19 is a block diagram illustrating another computing system including the memory device according to an exemplary embodiment of the inventive concept.

FIG. 19 is a block diagram illustrating an computing system including a memory device according to an exemplary embodiment of the inventive concept.

Referring to FIG. 19, a computing system 1100 includes a processor 1110, an input/output hub (IOH) 1120, an input/output controller hub (ICH) 1130, at least one memory module 1140 and a graphics card 1150. In exemplary embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In exemplary embodiments, the processor 1110 may include a single core or multiple cores. For example, the processor 1110 may be a multi-core processor, such as a dual-core processor, a quad-core processor, a hexa-core processor, etc. Although FIG. 19 illustrates the computing system 1100 including one processor 1110, in some exemplary embodiments, the computing system 1100 may include a plurality of processors. The processor 1110 may include an internal or external cache memory.

The processor 1110 includes a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 is coupled. In some exemplary embodiments, the memory controller 1111 may be located inside the input/output hub 1120, which may be referred to as a memory controller hub (MCH).

The memory module 1140 may include a plurality of resistive memory devices that store data provided from the memory controller 1111. Each of the resistive memory devices may be embodied with the memory device 100 of FIG. 1. The memory devices may be understood based on the references to FIGS. 1 through 15.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a QuickPath interconnect (QPI), a common system interface (CSI), etc. Although FIG. 19 illustrates the computing system 1100 including one input/output hub 1120, in some exemplary embodiments, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal resistive type memory device. In some exemplary embodiments, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some exemplary embodiments, the processor 1110, the input/output hub 1120 and the input/output controller hub 1130 may be implemented as separate chipsets or separate integrated circuits. In an exemplary embodiment, at least two of the processor 1110, the input/output hub 1120 and the input/output controller hub 1130 is implemented as a single chipset.

Embodiments of the inventive concept may be used in a resistive memory device or a system including the resistive memory device, such as a mobile phone, a smart phone, a personal digital assistants (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, etc.

The foregoing is illustrative of exemplary embodiments of the inventive concept and is not to be construed as limiting thereof. Although a few exemplary embodiments have been described, those skilled in the art will readily appreciate that many modifications are possible in the exemplary embodiments without materially departing from the present inventive concept. Accordingly, all such modifications are intended to be included within the scope of the present inventive concept.

What is claimed is:
1. A memory device comprising:
a memory cell array including a normal memory region and a redundant memory region, the normal memory region operating in response to a data signal and a plurality of normal memory region signals, the redun- dant memory region operating in response to the data signal and a plurality of redundant memory region signals; and an address decoder including a normal memory region signal generator and a redundant memory region signal generator, wherein the normal memory region signal generator activates first normal memory region signals and the redundant memory region signal generator activates a first redundant memory region signal simultaneously when the address decoder operates in a test mode, wherein the first normal memory region signals correspond to an address signal and are included in the plurality of the normal memory region signals, wherein the first redundant memory region signal corresponds to the address signal and is included in the plurality of the redundant memory region signals, wherein the normal memory region signal generator deactivates the first normal memory region signals when one of the redundant memory region signals is activated when the address decoder operates in a normal mode, wherein the address decoder further includes a block signal generator configured to output a result of performing a logical OR operation on the plurality of the redundant memory region signals as a block signal.

2. The memory device of claim 1, wherein when the address decoder operates in the test mode, the plurality of the redundant memory region signals are activated once respectively while the plurality of the normal memory region signals are activated once respectively.

3. The memory device of claim 1, wherein the memory cell array includes a plurality of blocks, the normal memory region includes a plurality of normal memory sub-regions, and the redundant memory region includes a plurality of redundant memory sub-regions.

4. The memory device of claim 3, wherein a first block among the blocks includes a first normal memory sub-region among the normal memory sub-regions and a first redundant memory sub-region among the redundant memory sub-regions, wherein a second block among the blocks includes a second normal memory sub-region among the normal memory sub-regions and a second redundant memory sub-region among the redundant memory sub-regions.

5. The memory device of claim 4, wherein the first normal memory region signals correspond to the first normal memory sub-region and the first redundant memory region signal corresponds to the first redundant memory sub-region.

6. The memory device of claim 4, wherein the first normal memory region signals correspond to the first normal memory sub-region and the first redundant memory region signal corresponds to the second redundant memory sub-region.

7. The memory device of claim 4, wherein the first redundant memory region signal corresponds to the first redundant memory sub-region when a sense amplifier generates an output signal by amplifying a data signal of a first memory cell included in the first block based on a reference signal of a second memory cell, which is included in the second block and corresponds to the first memory cell, and the first normal memory region signals correspond to the first normal memory sub-region.

8. The memory device of claim 3, wherein the blocks includes a first block and a second block, wherein the first block includes a first normal memory sub-region among the normal memory sub-regions and a first redundant memory sub-region among the redundant memory sub-regions, wherein the second block includes a second normal memory sub-region among the normal memory sub-regions.

9. The memory device of claim 8, wherein the first normal memory region signals correspond to the first normal memory sub-region and the first redundant memory region signal corresponds to the first redundant memory sub-region.

10. The memory device of claim 8, wherein the first normal memory region signals correspond to the second normal memory sub-region and the first redundant memory region signal corresponds to the first redundant memory sub-region.

11. The memory device of claim 1, wherein when the address decoder operates in the test mode, the normal memory region signal generator activates the first normal memory region signals.

12. The memory device of claim 1, wherein the normal memory region signal generator activates the first normal memory region signals when the normal memory region signal generator operates in a normal mode and the block signal has a logical low level, wherein the normal memory region signal generator deactivates the plurality of the normal memory region signals when the normal memory region signal generator operates in the normal mode and the block signal has a logical high level.

13. The memory device of claim 1, wherein the address decoder operates in the test mode when a test signal has a logical high level, wherein the address decoder operates in a normal mode when the test signal has a logical low level.

14. The memory device of claim 13, wherein the redundant memory region signal generator comprises:

a first redundant memory region signal generation unit configured to generate first internal redundant memory region signals which are activated once respectively while the plurality of the normal memory region signals are activated once respectively based on the address signal;

a second redundant memory region signal generation unit configured to generate second internal redundant memory region signals by comparing a value of the address signal and faulty address values stored in a fuse circuit; and a selection unit configured to output the first internal redundant memory region signals as the plurality of the redundant memory region signals when the test signal has the logical high level, configured to output the second internal redundant memory region signals as the plurality of the redundant memory region signals when the test signal has the logical low level, wherein the first redundant memory region signal generation unit includes an activation frequency controller configured to deactivate the first internal redundant memory region signals when a portion of the address signal is different from a user pre-determined value.

15. The memory device of claim 13, wherein the redundant memory region signal generator comprises:

a redundant memory region signal generation unit configured to generate internal redundant memory region signals by comparing a value of the address signal and faulty address values stored in a fuse circuit; and a selection unit configured to output a portion of the plurality of the normal memory region signals as the plurality of the redundant memory region signals when the test signal has the logical high level, configured to output the internal redundant memory region signals as the plurality of the redundant memory region signals when the test signal has the logical low level.

16. A memory device comprising:
a memory cell array including a normal memory region and a redundant memory region; and
an address decoder configured to simultaneously activate a plurality of normal memory signals and a first redundant memory region signal during a test mode, apply the normal memory signals to the normal memory region to perform a first test of the normal memory region, and apply the first redundant memory region signal to perform a second test of a first part of the redundant memory region,
wherein the memory device deactivates a first memory cell in the first part of the redundant memory region when the second test determines the first memory cell is faulty, and the memory device replaces a second memory cell in the normal memory region with the first memory cell when the first test determines the second memory cell is faulty and the first memory cell is non-faulty.

17. A memory device comprising:
a memory cell array including a normal memory region and a redundant memory region;
an address decoder configured to simultaneously activate a plurality of normal memory signals and a first redundant memory region signal during a test mode, apply the normal memory signals to the normal memory region to test the normal memory region, and apply the first redundant memory region signal to test a first part of the redundant memory region; and
an OR gate configured to perform an OR operation on the first redundant memory region signal and a second redundant memory region signal, wherein the address decoder activates the normal memory region signal during a normal mode when a block signal has a logical low level,
wherein the address decoder deactivates the normal memory region signals during the normal mode when the block signal has a logical high level, and wherein the second redundant memory signal is used to test a second part of the redundant memory region different from the first part.

* * * * *